(12) United States Patent
Nakamura et al.

(10) Patent No.: US 6,262,922 B1
(45) Date of Patent: Jul. 17, 2001

(54) SEMICONDUCTOR MEMORY DEVICE

(75) Inventors: Kenichi Nakamura, Tokyo-To; Takashi Ito; Yutaka Yoshitani, both of Yokohama; Tomokazu Kawase, Odawara, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/542,544

(22) Filed: Apr. 3, 2000

(30) Foreign Application Priority Data

Apr. 1, 1999 (JP) .................................................. 11-095551

(51) Int. Cl.$^7$ ....................................................... G11C 7/00
(52) U.S. Cl. ................ 365/196; 365/189.04; 365/230.06
(58) Field of Search ............................... 365/196, 189.04, 365/189.07, 203, 189.08, 190, 189.05, 230.06

(56) References Cited

U.S. PATENT DOCUMENTS

| | | |
|---|---|---|
| 4,758,987 | 7/1988 | Sakui . |
| 5,555,212 * | 9/1996 | Toshiki et al. ........................ 365/200 |
| 5,654,935 * | 8/1997 | Hisada et al. ....................... 365/233.5 |
| 5,970,006 * | 10/1999 | Numata et al. ....................... 365/203 |

FOREIGN PATENT DOCUMENTS 5-144253    6/1993   (JP) .

* cited by examiner

*Primary Examiner*—David Nelms
*Assistant Examiner*—Thong Le
(74) *Attorney, Agent, or Firm*—Finnegan, Henderson, Farabow, Garrett & Dunner, L.L.P.

(57) ABSTRACT

There is provided a DRAM capable of carrying out rapid data readout. The DRAM includes a memory cell array 1; a row decoder 3 for selectively driving word lines; a bit line sense amplifier 2 for controlling data, which are read out to a plurality of bit lines by driving the word lines, by a first sense amplifier activating signal to detect and amplify the data; a column selecting gate 5, which is driven by a column selecting signal generated behind the first sense amplifier activating signal, for connecting the selected bit line to a corresponding data line; and a data line sense amplifier, which is connected to the data line and which is controlled by a second sense amplifier activating signal generated behind the column selecting signal, the data line sense amplifier being associated with the bit line sense amplifier for detecting and amplifying data transmitted to the data line by the data selecting gate 5.

20 Claims, 7 Drawing Sheets

SEMICONDUCTOR MEMORY DEVICE

BACKGROUND OF THE INVENTION

1. Field of the Invention

The present invention relates generally to a semiconductor memory device. More specifically, the invention relates to a dynamic semiconductor memory device (DRAM) required to rewrite read data.

2. Related Background Art

A memory cell array of a DRAM is formed by providing bit lines and word lines, which intersect each other, and by arranging dynamic memory cells, each of which has one transistor/one capacitor, at the respective intersections. Each of the bit lines of the memory array is provided with a bit line sense amplifier. By selectively driving the word lines, data of a plurality of memory cells are read out to a plurality of corresponding bit lines. These bit line data are selected by a column selecting gate to be transferred to a corresponding data line. The data transferred to the data line are detected and amplified by a corresponding one of data line sense amplifiers to be outputted.

Thus, in the data readout operation for the DRAM, the bit line data are detected and amplified by the corresponding one of the bit line sense amplifiers having a small drive capacity. Therefore, after the potential amplitude of the bit lines increases to such an extent that data destruction does not occur, the column selecting gate is open, so that the bit line data are transmitted to the data line (step (a)). Because, if not so, there is the possibility that data destruction occurs due to charge distribution caused by connecting the bit lines to the corresponding data line. After the bit line data are transferred to the data line, the data line is separated from the corresponding one of the data line sense amplifiers, and the transferred data are amplified to a full amplification level to be outputted (step (b)). The reason why the data line is separated is that a data line capacity is separated from the corresponding one of the data line sense amplifiers to carry out rapid detection and amplification.

In the above described typical data readout method for DRAMs, there is a problem in order to further promote the capacity increase, scale down and accelerating of DRAMs. That is, with the capacity increase and scale down of DRAMs, a large number of memory cells are connected to bit lines, so that the bit line capacity increases. On the other hand, with the scale down, the drive capacity of the bit line sense amplifier, which must be arranged in a bit line pitch, relatively decreases. Therefore, it takes a lot of time to amplify data read out to the bit lines, to some extent of amplitude. This obstructs rapid readout.

Conventionally, as rapid data readout techniques for DRAMs, there are proposed (1) a system for providing a read-only sense amplifier and a restore-only sense amplifier in a bit line (Japanese Patent Laid-Open No. 8-147975), and (2) a system for providing a global bit line shared by a plurality of bit lines in a memory array, providing a pre-sense amplifier in each of the bit lines, and providing a restoring sense amplifier in the global bit line (Japanese Patent Laid-Open No. 5-144253).

However, in these systems, although the sense amplifiers are divided every function, all of the sense amplifiers must be arranged in a bit line pitch in a memory cell array region on a layout. As described above, in the memory array region, the bit line pitch is very small by the scale down technique, so that there is a limit to the drive capacity of the sense amplifier arranged in the memory cell array region.

SUMMARY OF THE INVENTION

It is therefore an object of the present invention to eliminate the aforementioned problems and to provide a dynamic semiconductor memory device capable of carrying out rapid data readout.

In order to accomplish the aforementioned and other objects, according to one aspect of the present invention, a semiconductor memory device comprises: a memory cell array including a plurality of bit lines, a plurality of word lines intersecting the bit lines, and a plurality of dynamic memory cells, each of said cells is arranged at a corresponding one of intersections between the bit lines and the word lines; a row decoder for selectively driving at least one of the word lines of said memory cell array; bit line sense amplifiers, which are connected to the bit lines of said memory cell array to be activated by a first sense amplifier activating signal for detecting and amplifying data read out to said plurality of bit lines, said data being read out responsive to the word line selectively driven by said row decoder; column selecting gates, which are selectively driven by a column selecting signal generated behind said first sense amplifier activating signal, for connecting selected said bit lines of said memory cell array to corresponding data lines; and a data line sense amplifier connected to said data lines to be activated by a second sense amplifier activating signal generated behind said column selecting signal, said data line sense amplifier being associated with said bit line sense amplifier for detecting and amplifying data read out to said bit lines and said data lines.

According to another aspect of the present invention, a semiconductor memory device comprises: a memory cell array including a plurality of bit lines, a plurality of word lines intersecting the bit lines, and a plurality of dynamic memory cells, each of said cells is arranged at a corresponding one of intersections between the bit lines and the word Lines; a row decoder for selectively driving at least one of the word lines of said memory cell array; bit line sense amplifiers, which are connected to the bit lines of said memory cell array to be activated by a first sense amplifier activating signal for detecting and amplifying data read out to said plurality of bit lines, said data being read out responsive to the word line selectively driven by said row decoder; column selecting gates, which are selectively driven by a column selecting signal generated behind said first sense amplifier activating signal, for connecting selected said bit lines of said memory cell array to corresponding data lines; and a data line sense amplifier connected to said data lines to be activated by a second sense amplifier activating signal generated behind said column selecting signal, said data line sense amplifier being associated with said bit line sense amplifier for detecting and amplifying data read out to said bit lines and said data lines, wherein data, which is selected by said column selecting signals, of data read out to said a plurality of bit lines, are detected and amplified simultaneously by said bit line sense amplifiers and said data line sense amplifier, for being rewritten in corresponding said memory cell, and data, which is not selected by said column selecting signal, of data read out to said a plurality of bit lines, are detected and amplified by only said bit line sense amplifiers, for being rewritten in corresponding said memory cell.

Specifically, data, which are selected by the column selecting gate, of data driven by the selected one of the word lines to be read out to the plurality of bit lines, may be detected and amplified simultaneously by the bit line sense amplifier and the data line sense amplifier to be rewritten in a corresponding one of the memory cells, and data, which are not selected by the column selecting gate, of data driven by the selected one of the word lines to be read out to the plurality of bit lines, may be detected and amplified by only the bit line sense amplifier to be rewritten in a corresponding one of the memory cells.

According to the present invention, the bit line sense amplifier and the data line sense amplifier are overlapped with each other to be activated to detect and amplify the bit line data, so that it is possible to carry out rapid data readout. That is, with the increase of the capacity of the bit line and the relative deterioration of the drive capacity of the bit line sense amplifier, the variation in amplitude of data read out to the bit line decreases. On the other hand, the data line sense amplifier can be formed so as to have a large drive capacity around the chip without being restricted to a design rule in a memory cell array region. Therefore, immediately after the column selecting gate is turned on, the data line sense amplifier having a large drive capacity is activated to be associated with the bit line sense amplifier for detecting and amplifying the bit line data, so that it is possible to rapidly read out the bit line data without destroying the bit line data.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

The prehistory that the present invention has been made will be explained hereinafter.

The present invention was made based on the inventors' own acquaintance or insight. In more detail, a person skilled in the art holds a firm believe that it is a common art to satisfy the two steps or conditions step (a) and step (b) discussed before to read data from DRAM. However, the present inventors have noticed that it is unnecessary to satisfy the conditions (a) and (b) to read date from DRAM. In other words, opening one of column select gates to transfer data from a bit line sense amplifier to corresponding data lines, then even if activating data line sense amplifier without shutting off between the data lines and data line sense amplifier, data read out is performed quickly on the basis of the operation of data line sense amplifier. In that time, read out data are never destroyed. As described the above, the present invention has been contrived based on the above acquaintance or insight. On the other hand, a person skilled in the art never arrived at the present invention because they have a common art that the two conditions or steps (a) and (b) are necessary to be satisfied or performed when data are read.

Referring now to the accompanying drawings, the preferred embodiments of the present invention will be described below.

Figure 1:
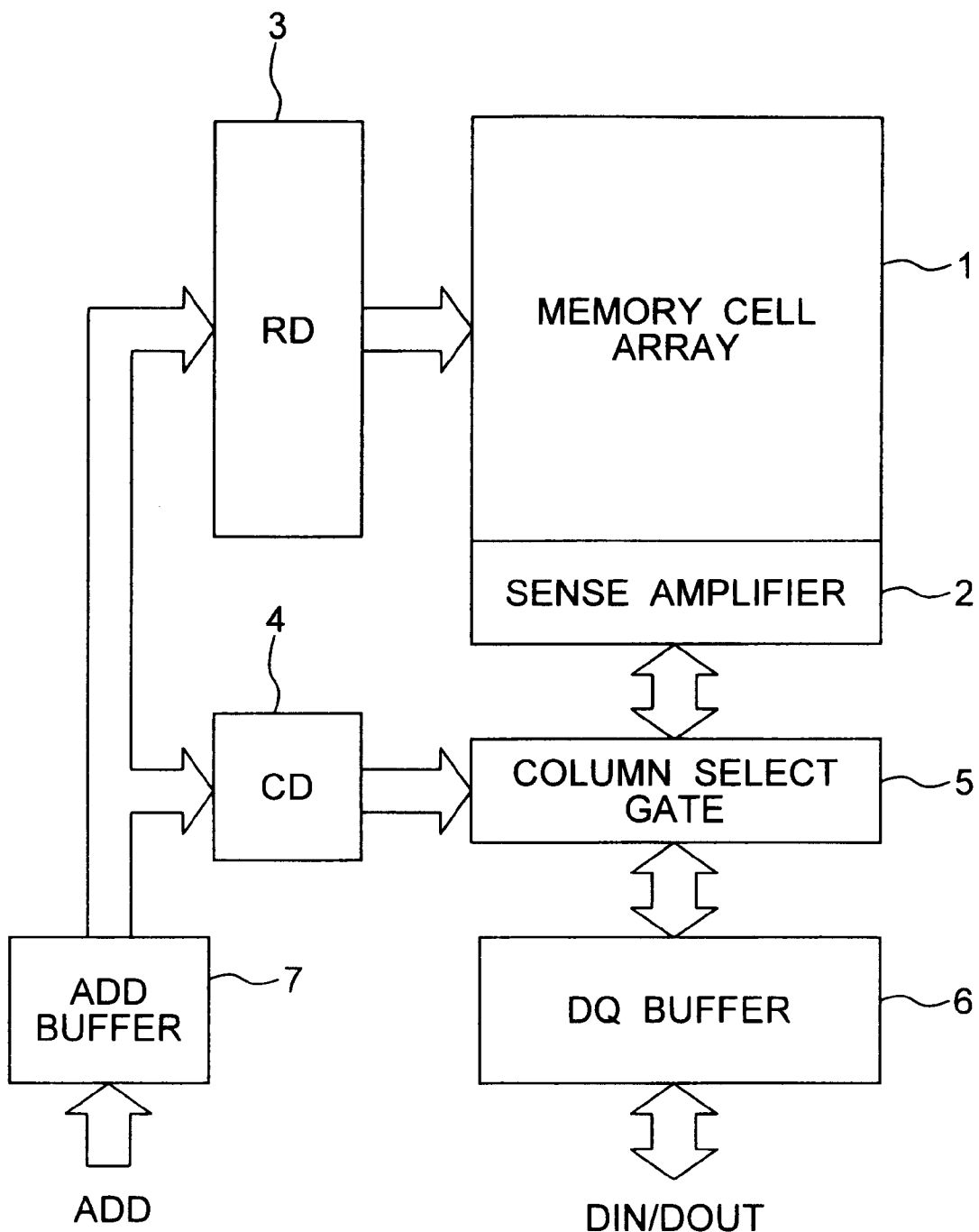
FIG. 1 is a block diagram of a preferred embodiment of a DRAM according to the present invention.

FIG. 1 is a block diagram showing a preferred embodiment of a DRAM according to the present invention. A memory cell array 1 comprises dynamic memory cells. A sense amplifier circuit 2 detects and amplifies memory cell data of the memory cell array 1, and writes data in memory cells. The data read out by the sense amplifier circuit 2 are selected by a column selecting gate 5 to be transferred to a data buffer 6 to be outputted to a data terminal DIN/DOUT. The write data given from the data terminal DIN/DOUT are written in the memory cells by the sense amplifier circuit 2 via the data buffer 6 and the column selecting gate 5.

An address buffer 7 acquires an address ADD. The acquired address is decoded by a row decoder 3 and a column decoder 4. The row decoder 3 selectively drives word lines of the memory cell array 1. The decode output of the column decoder 4 is fed to the column selecting gate 5, so that the selection of bit lines of the memory cell array 1 is carried out.

Figure 2:
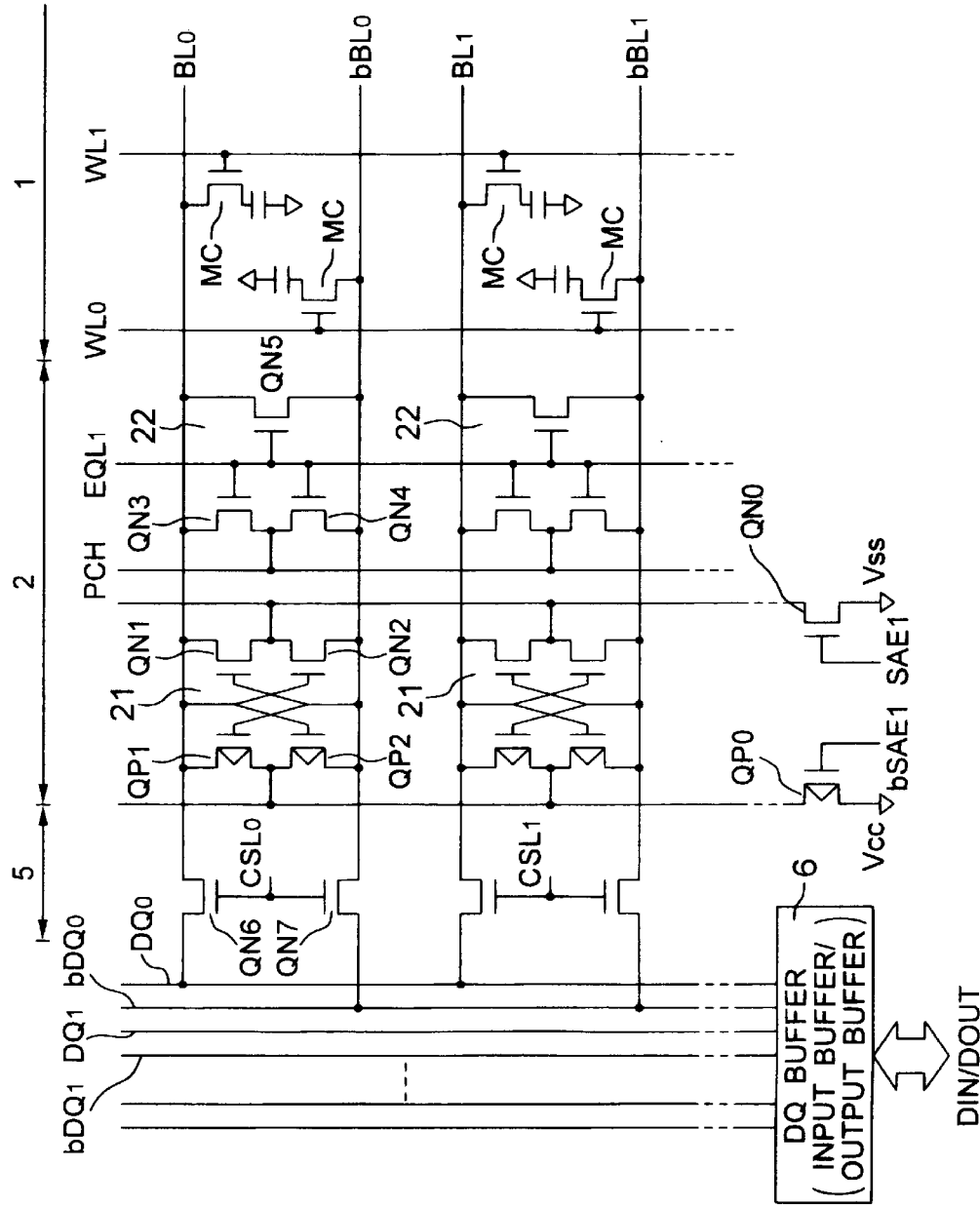
FIG. 2 is a circuit diagram showing the detailed constructions of a memory cell array of the DRAM in the preferred embodiment and the peripheral thereof.

FIG. 2 shows the detailed construction of a principal part of the DRAM of FIG. 1. As shown in this figure, the memory cell array 1 comprises a plurality of word lines WL (WL0, WL1, ... ), a plurality of pairs of bit lines BL, bBL (BL0, bBL0, BL1, bBL1, ... ) intersecting the word lines, and well-known dynamic memory cells MC arranged at the intersections therebetween. The sense amplifier circuit 2 has a plurality of bit line sense amplifiers 21, each of which is provided in the bit lines BL and bBL of each pair of the pairs of bit lines BL and bBL, and a plurality of bit line equalizer circuits 22, each of which is provided in the bit lines BL and bBL of each pair of the pairs of bit lines BL and bBL. Each of the bit line sense amplifiers 21 has PMOS transistors QP1 and QP2, the drains of which are connected to the corresponding pair of bit lines BL and bBL, respectively, and the sources of which are commonly connected to constitute a PMOS sense amplifier, and NMOS transistors QN1 and QN2, the drains of which are connected to the corresponding pair of bit lines BL and bBL, respectively, and the sources of which are commonly connected to constitute an NMOS sense amplifier.

The common source of the PMOS transistors QP1 and QP2 is connected to VCC via an activating PMOS transistor QP0. The common source of the NMOS transistors QN1 and QN2 is connected to VSS via an activating NMOS transistor QN0. These activating transistors QP0 and QN0 are driven by complementary activating signals bSAE1 and SAE1, respectively.

Each of the bit line equalizer circuit 22 has an equalizing NMOS transistor QN5 controlled by an equalizing signal EQL1 for establishing a short circuit between the corresponding pair of bit lines BL and bBL, and pre-charging NMOS transistors QN3 and QN4 controlled by the equalizing signal EQL1 for applying a pre-charge potential PCH to the corresponding pair of bit lines BL and bBL, respectively. In this preferred embodiment, PCH=VCC/2 is used as the pre-charge potential PCH.

Each pair of bit lines BL and bBL are connected to corresponding data lines DQ and bDQ (DQ0, bDQ0, DQ1, bDQ1, ...) via the column selecting gate 5, respectively. The column selecting gate 5 comprises NMOS transistors QN6 and QN7 which are driven by column selecting lines CSL (CSL0, CSL1, ...) selected by the column decoder 4. In FIG. 2, two pairs of bit lines (BL0, bBL0), (BL1, bBL1) selected by the column selecting lines CSL0 and CSL1 at different timings are connected to the pair of data lines DQ0 and bDQ0.

Figure 3:
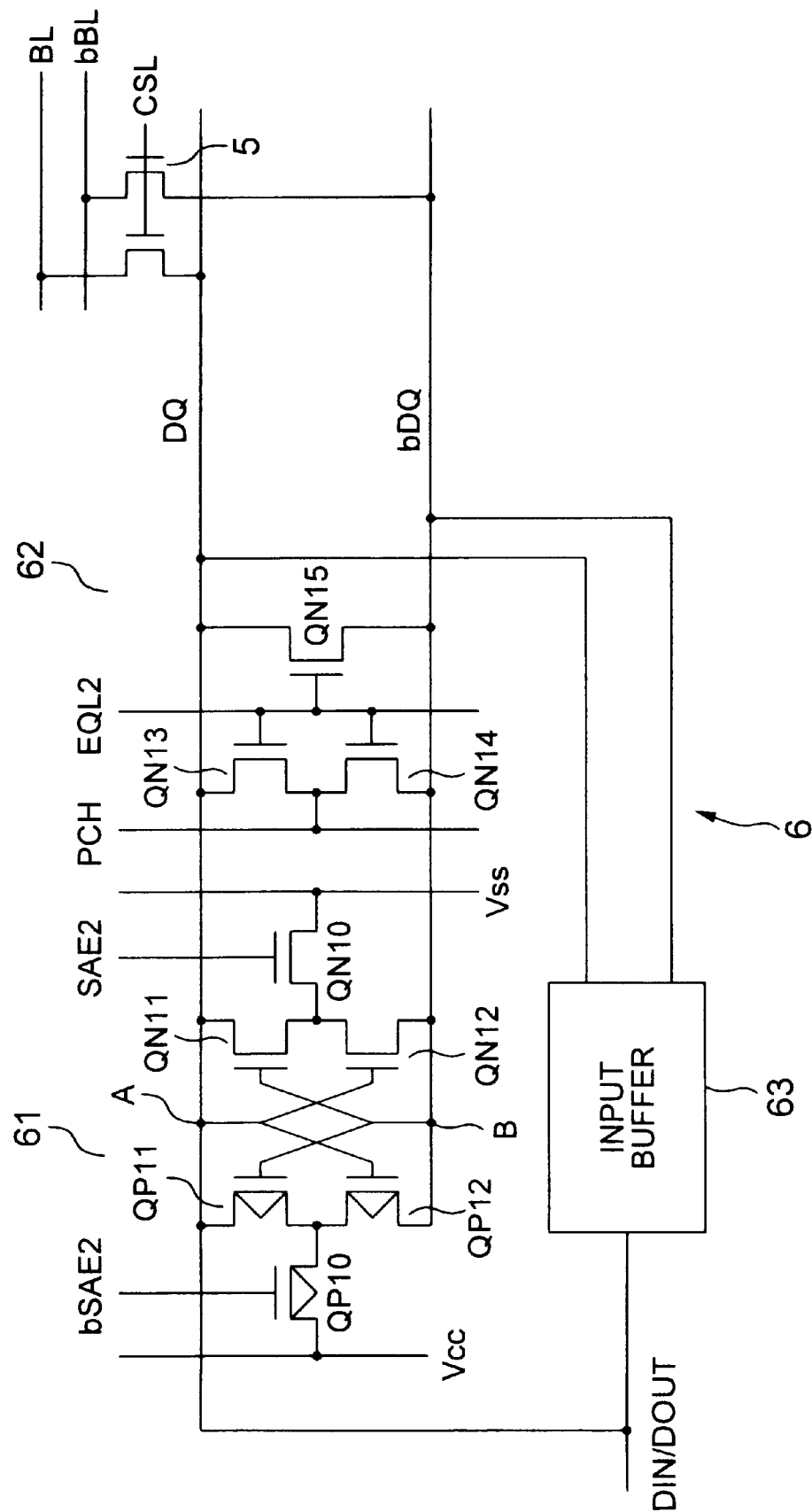
FIG. 3 is a circuit diagram showing the detailed construction of a data buffer part of the DRAM in the preferred embodiment.

FIG. 3 shows the construction of the data buffer 6 taking notice of a pair of data lines DQ and bDQ. The input buffer 63 is a part of DQ buffer 6 of FIG. 1. The data buffer 6 has a data line sense amplifier 61 for detecting and amplifying read data, and an input buffer 63 for acquiring write data. The data line sense amplifier 61 has PMOS transistors QP11 and QP12, the drains of which are connected to the pair of data lines DQ and bDQ, respectively, and the sources of which are commonly connected to constitute a PMOS sense amplifier, and NMOS transistors QN11 and QN12, the drains of which are connected to the pair of data lines DQ and bDQ, respectively, and the sources of which are commonly connected to constitute an NMOS sense amplifier.

The common source of the PMOS transistors QP11 and QP12 is connected to VCC via an activating PMOS transistor QP10. The common source of the NMOS transistors QN11 and QN12 is connected to VSS via an activating NMOS transistor QN10. These activating transistors QP10 and QN10 are driven by complementary activating signals bSAE2 and SAE2, respectively.

The pair of data lines DQ and bDQ are also provided with a data line equalizer circuit 62. The data line equalizer circuit 62 has an equalizing NMOS transistor QN15 controlled by an equalizing signal EQL2 for establishing a short circuit between the pair of data lines DQ and bDQ, and pre-charging NMOS transistors QN13 and QN14 controlled by the equalizing signal EQL2 for applying a pre-charge potential PCH to the pair of data lines DQ and bDQ, respectively. Similar to the bit lines, the pre-charge potential PCH is PCH=VCC/2.

Figure 7:
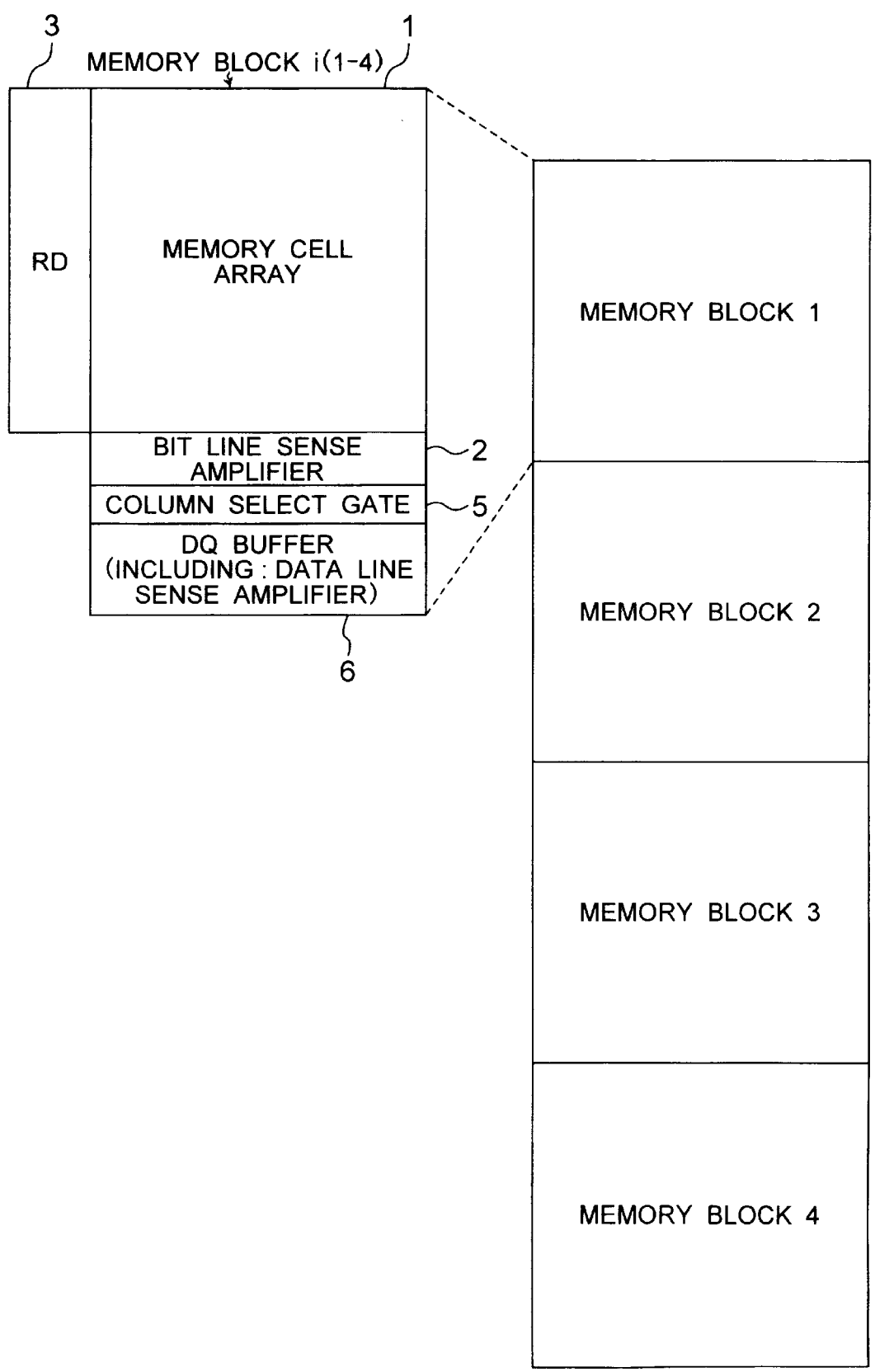
FIG. 7 is a block diagram showing a plurality of memory blocks, each of which showing a relationship between a memory cell array and a data line sense amplifier.

Referring to FIGS. 2 and 3, the bit line sense amplifier circuit 2 is formed and arranged between the bit lines BL and bBL. On the other hand, the data line sense amplifier 61 is formed and arranged as a large drive type so as to leave a margin around the chip (around the memory cell array). One embodiment is shown in FIG. 7. FIG. 7 shows four memory blocks, each of which including memory cell array 1 and DQ buffer 6 (including data line sense amplifier 61) and so on, and the relationship thereof is shown in the figure. As known from FIG. 7, data line sense amplifiers 61 are arranged in a preferal portion of the memory cell array 1.

In this preferred embodiment, as shown in FIGS. 2 and 3, no transfer gate is provided between the sense nodes A, B of the data line sense amplifier 61 and the data lines DQ, bDQ, similar to the conventional case. Therefore, in this preferred embodiment, data transferred from the pair of bit lines BL and bBL to the pair of data lines DQ and bDQ by the column selecting gate 5 during data readout are detected and amplified by the data line sense amplifier 61 without separating the data lines. At this time, the data sense amplifier 61 and the bit line sense amplifier 21 are simultaneously maintained in an activated state, so that these amplifiers are associated with each other for amplifying the potentials of the pair of data lines DQ, bDQ and the selected pair of bit lines BL, bBL to full amplitudes to rewrite (restore) data in the selected memory cell.

Figure 4:
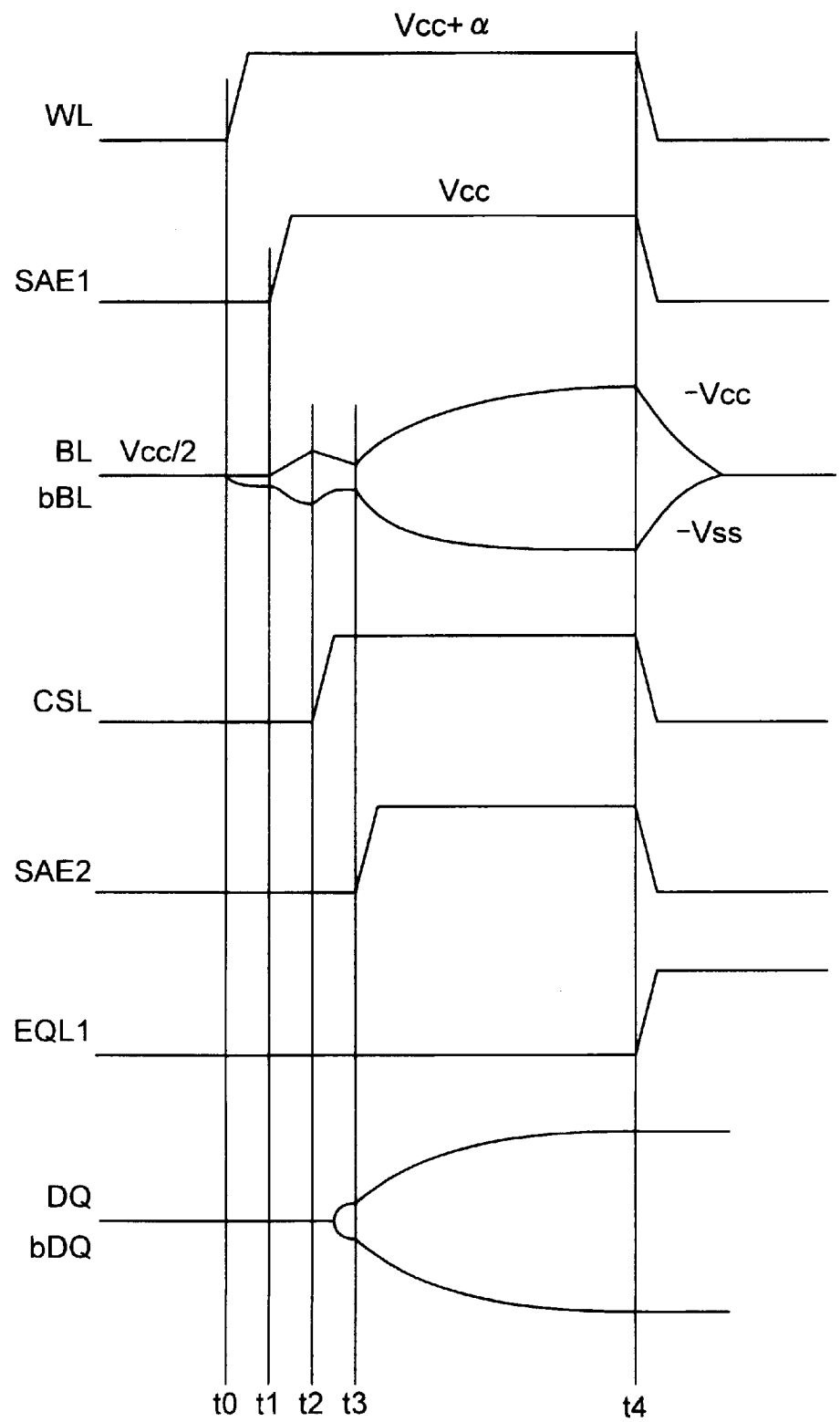
FIG. 4 is a waveform illustration showing a data readout operation for the DRAM in the preferred embodiment.

FIG. 4 is a basic operation timing chart of the DRAM in this preferred embodiment. In the initial state, a pair of bit lines BL and bBL and a pair of data lines DQ and bDQ are pre-charged to VCC/2. At time t0, a word line WL selected by the row decoder rises. Usually, as a voltage for driving the word line WL, VCC+α a boosted from the power supply potential VCC is used. Thus, data of the selected memory cell are transferred to the pair of bit lines BL and bBL.

Then, at time t1, the activating signals of a bit line sense amplifier 21 become SAE1="H" and bSAE1="L", so that the potential difference between the pair of bit lines BL and bBL is amplified by the bit line sense amplifier 21. The variation in amplitude thereof is gentle since the drive capacity of the bit line sense amplifier 21 is small. Thereafter, at time t2, the column selecting gate 5 of the pair of bit lines BL and bBL selected from the plurality of pairs of bit lines is turned on, so that data of the selected pair of bit lines BL and bBL are transferred to the corresponding pair of data lines DQ and bDQ. By this data transfer, the potential difference between the selected pair of bit lines BL and bBL decreases once. Immediately thereafter, at time t3, the data line sense amplifier activating signals become SAE2="H" and bSAE2="L", so that a data line sense amplifier 61 is activated.

Thus, the selected bit line data are detected and amplified simultaneously by the bit line sense amplifier 21 and the data line sense amplifier 61 having a larger drive capacity than that of the bit line sense amplifier 21. That is, the minute potential difference between the pair of bit lines BL and bBL is magnified to such an extent that one is VCC and the other is VSS, and read out to the data terminal. Simultaneously, the read data are restored in the selected memory cell by the data line sense amplifier 61 and the bit line sense amplifier 21.

At this time, data of the pair of bit lines BL and bBL which have not been selected by the column selecting gate 5 while being selected by the same word line WL are slowly detected and amplified by only the bit line sense amplifier 21, and then, restored in the same memory cell.

Then, at time t4, the selecting word line WL falls, and simultaneously, the sense amplifier activating signals SAE1 and SAE2 fall. Simultaneously, the bit line equalizing signal EQL1 rises to activate the bit line equalizer circuit 22, so that the pair of bit lines BL and bBL having the full amplitude are initialized to VCC/2.

As described above, according to this preferred embodiment, immediately after the bit line data are transferred to the data line, the data line sense amplifier is activated, so that the data signal is amplified simultaneously by the bit line sense amplifier and the data line sense amplifier. The data line sense amplifier can have a far larger drive capacity than that of the bit line sense amplifier. Therefore, by activating the data line sense amplifier substantially simultaneously with the transfer of the bit line data to the data line, rapid readout is carried out without causing data destruction.

Figure 5:
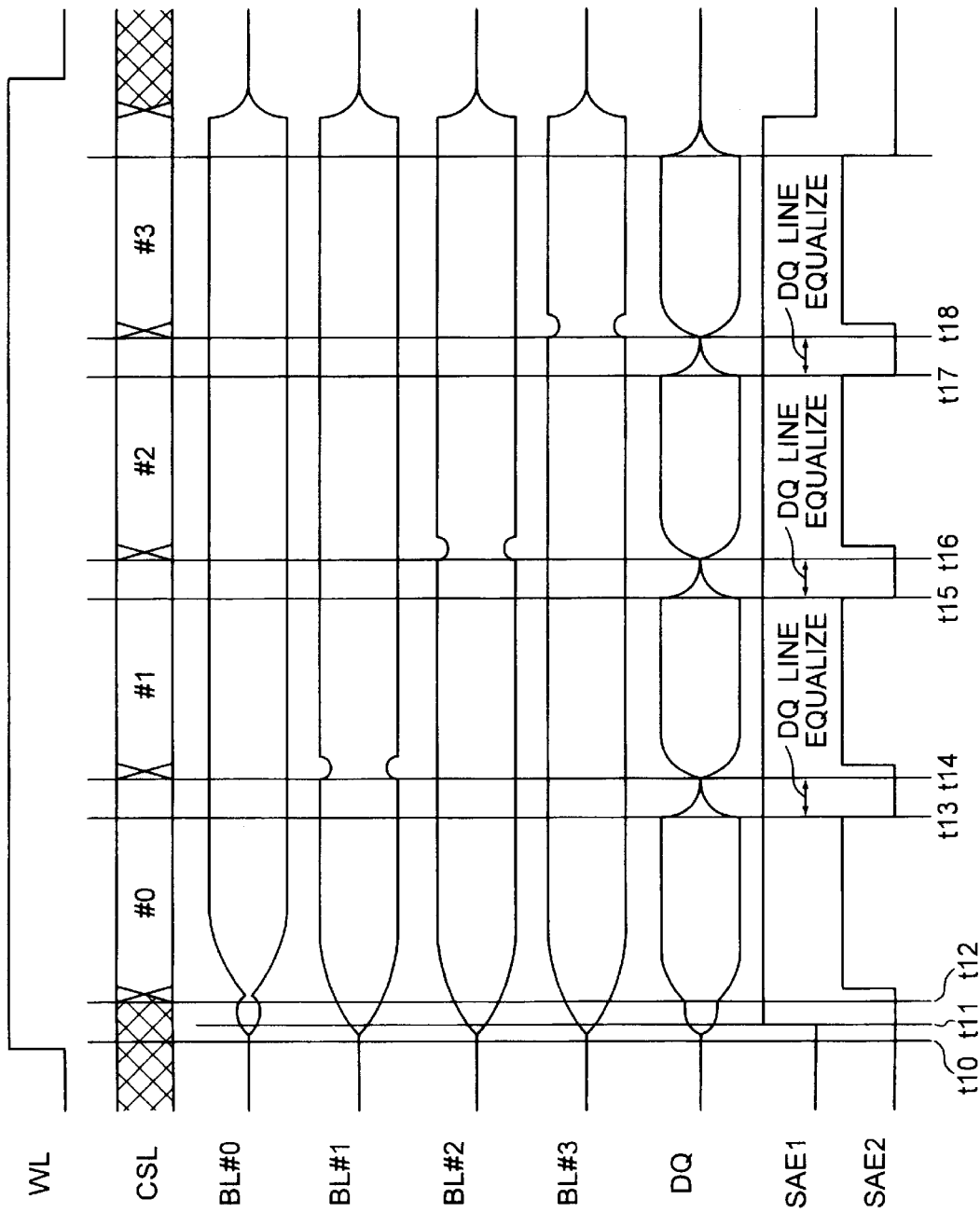
FIG. 5 is a waveform illustration showing a data readout operation for another preferred embodiment of a DRAM according to the present invention.

A typical DARM has the function of inputting one row address to serially read data of a plurality of columns. FIG. 5 shows a waveform in a data readout operation of a DRAM having such a function.

In the example shown in FIG. 5, at time t0, the word line WL rises, and thereafter, column selecting lines CSL are sequentially selected from #0 to #3 in the state that the word line WL remains being "H".

After the word line WL rises, at time t11, the activating signal SAE1 of the bit line sense amplifier rises. Subsequently, at time t12, the column selecting line CSL of #0 rises, so that the bit line data of that column are transferred to the data line DQ. Then, the activating signal SAE2 of the data line sense amplifier rises without being so delayed from the column selection. Thus, the bit line data selected by the column selecting line CSL of #0 are amplified simultaneously by the data line sense amplifier and the bit line sense amplifier similar to the preceding preferred embodiment.

In the meantime, in the bit lines BL of unselected other columns #1 through #3, data are slowly amplified by only the bit line sense amplifier. Then, at time t13 before the column is switched, the activating signal SAE2 of the data line sense amplifier becomes "L", and then, the data line DQ is equalized before the next column selection is carried out. Then, at time t14, the next column selecting line CSL rises. Thus, the bit line data of column #1 are transferred to the equalized data line DQ, and amplified simultaneously by the data line sense amplifier and the bit line sense amplifier similar to the last cycle. Thereafter, the same operation is repeated. Until the selection of all of columns #0 through #3 is completed, the activating signal SAE1 of the bit line sense amplifier remains being "H".

Also according to this preferred embodiment, particularly with respect to the first selected column, the bit line sense amplifier is associated with the data line sense amplifier for allowing rapid data readout.

Figure 6:
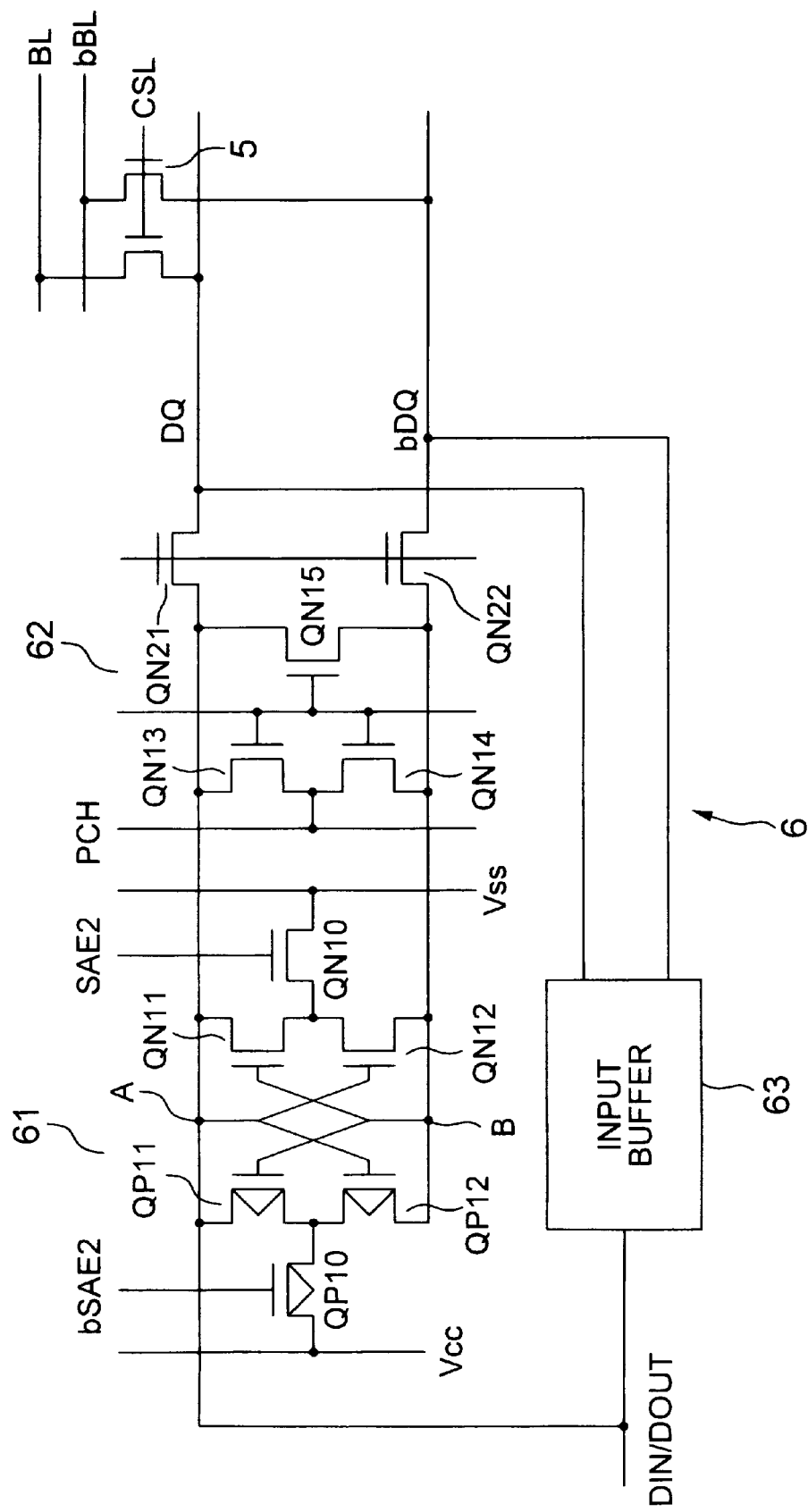
FIG. 6 is a circuit diagram showing the construction of a data buffer part of another preferred embodiment of a DRAM according to the present invention.

FIG. 6 shows the construction of an output buffer 6 in another preferred embodiment of a DRAM according to the present invention. The same reference numbers are used for parts corresponding to those in FIG. 3, and the detailed descriptions thereof are omitted. In this preferred embodiment unlike FIG. 3, NMOS transistors QN21 and QN22 for separating a data line sense amplifier 61 from a pair of data lines DQ and bDQ are provided between the pair of data lines DQ, bDQ and sense nodes A, B.

However, the NMOS transistors QN21 and QN22 are not used for separating the data line sense amplifier 61 from the pair of data lines DQ and bDQ during data readout unlike the conventional case. In the data readout operation, the NMOS transistors QN21 and QN22 remain being turned on, and the data line sense amplifier 61 is associated with the bit line sense amplifier for detecting, amplifying and restoring cell data similar to the preceding preferred embodiment.

When it is required to separate the data line sense amplifier 61 from an input buffer 63, the NMOS transistors QN21 and QN22 are turned off. That is, when write data are fed from the input buffer 63 to the pair of data lines DQ and bDQ while data read out to the data line sense amplifier 61 are held, the NMOS transistors QN21 and QN22 are turned off so as not to destroy data held by the data line sense amplifier 61.

Also according to this preferred embodiment, the data line sense amplifier is associated with the bit line sense amplifier for detecting and amplifying data without separating the data line sense amplifier from the pair of data lines during data readout, so that it is possible to carry out rapid data readout. According to the circuit of FIG. 6, it is possible that the data line sense amplifier maintains the last read out data during a write operation.

As described above, according to the present invention, it is possible to provide a DRAM capable of carrying out rapid data readout by simultaneously activating the bit line sense amplifier and the data line sense amplifier to carry out data sense.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:
a memory cell array including a plurality of bit lines, a plurality of word lines intersecting the bit lines, and a plurality of dynamic memory cells, each of said cells is arranged at a corresponding one of intersections between the bit lines and the word lines;
a row decoder for selectively driving at least one of the word lines of said memory cell array;
bit line sense amplifiers, which are connected to the bit lines of said memory cell array to be activated by a first sense amplifier activating signal for detecting and amplifying data read out to said plurality of bit lines, said data being read out responsive to the word line selectively driven by said row decoder;
column selecting gates, which are selectively driven by a column selecting signal generated behind said first sense amplifier activating signal, for connecting selected said bit lines of said memory cell array to corresponding data lines; and
a data line sense amplifier connected to said data lines to be activated by a second sense amplifier activating signal generated behind said column selecting signal, said data line sense amplifier being associated with said bit line sense amplifier for detecting and amplifying data read out to said bit lines and said data lines, wherein data, which is selected by said column selecting signals, of data read out to said plurality of bit lines, are detected and amplified simultaneously by said bit line sense amplifiers and said data line sense amplifier, for being rewritten in corresponding said memory cell.

2. A semiconductor memory device comprising:
a memory cell array including a plurality of bit lines, a plurality of word lines intersecting the bit lines, and a plurality of dynamic memory cells, each of said cells is arranged at a corresponding one of intersections between the bit lines and the word lines;
a row decoder for selectively driving at least one of the word lines of said memory cell array;
bit line sense amplifiers, which are connected to the bit lines of said memory cell array to be activated by a first sense amplifier activating signal for detecting and amplifying data read out to said plurality of bit lines, said data being read out responsive to the word line selectively driven by said row decoder;
column selecting gates, which are selectively driven by a column selecting signal generated behind said first sense amplifier activating signal, for connecting selected said bit lines of said memory cell array to corresponding data lines; and
a data line sense amplifier connected to said data lines to be activated by a second sense amplifier activating signal generated behind said column selecting signal, said data line sense amplifier being associated with said bit line sense amplifier for detecting and amplifying data read out to said bit lines and said data lines, wherein data, which is selected by said column selecting signals, of data read out to said plurality of bit lines, are detected and amplified simultaneously by said bit line sense amplifiers and said data line sense amplifier, for being rewritten in corresponding said memory cell, and data, which is not selected by said column selecting signal, of data read out to said a plurality of bit lines, are detected and amplified by only said bit line sense amplifiers, for being rewritten in corresponding said memory cell.

3. The semiconductor memory device as set forth in claim 1, wherein said plurality of bit lines form pairs of bit lines, each pair of which comprises adjacent two of said plurality of bit lines, and wherein when data are read out, data of a selected one of said memory cells are outputted to one bit line of each pair of said pairs of bit lines, and data of said selected one of said memory cells are detected by comparing a potential of said one bit line with a potential of the other bit line of a corresponding pair of said pairs of bit lines.

4. The semiconductor memory device as set forth in claim 2, wherein said plurality of bit lines form pairs of bit lines, each pair of which comprises adjacent two of said plurality of bit lines, and wherein when data are read out, data of a selected one of said memory cells are outputted to one bit line of each pair of said pairs of bit lines, and data of said selected one of said memory cells are detected by comparing a potential of said bit line with a potential of the other bit line of a corresponding one pair of said pairs of bit lines.

5. The semiconductor memory device as set forth in claim 3, wherein an equalizing transistor is provided between each pair of bit lines of said pairs of bit lines for conducting said bit lines of each pair to each other.

6. The semiconductor memory device as set forth in claim 4, wherein an equalizing transistor is provided between each pair of bit lines of said pairs of bit lines for conducting said bit lines of each pair to each other.

7. The semiconductor memory device as set forth in claim 3, wherein one of said bit lines of each pair of said pairs of bit lines is connected to said one of data lines via one of said column selecting gates, and the other is connected to another of said data lines via said column selecting gate.

8. The semiconductor memory device as set forth in claim 4, wherein one of said bit lines of each pair of said pairs of bit lines is connected to one of said data lines via one of said column selecting gates, and the other is connected to another of said data lines via said column selecting gate.

9. The semiconductor memory device as set forth in claim 3, wherein each of said bit line amplifiers is formed and arranged between said bit lines of each pair of said pairs of bit lines, and said data line sense amplifier is formed and arranged between corresponding two of said data lines in a peripheral region around said memory cell array region.

10. The semiconductor memory device as set forth in claim 4, wherein each of said bit line amplifiers is formed and arranged between said bit lines of each pair of said pairs of bit lines, and said data line sense amplifier is formed and arranged between corresponding two of said data lines in a peripheral region around said memory cell array region.

11. The semiconductor memory device as set forth in claim 9, which further comprises two switches, provided between each of said two of said data lines and said data line sense amplifier formed and arranged therebetween, for connecting and disconnecting between said two of said data lines and said data line sense amplifier.

12. The semiconductor memory device as set forth in claim 10, which further comprises two switches, provided between each of said two of said data lines and said data line sense amplifier formed and arranged therebetween, for conducting and disconnecting between said two of said data lines and said data line sense amplifier.

13. The semiconductor memory device as set forth in claim 11, wherein a data input buffer for transmitting write data to one of said memory cells is connected to one end of said two of said data lines.

14. The semiconductor memory device as set forth in claim 12, wherein a data input buffer for transmitting write data to one of said memory cells is connected to one end of said two of said data lines.

15. The semiconductor memory device as set forth in claim 13, wherein said data input buffer is connected to said two of said data lines upstream of said two switches.

16. The semiconductor memory device as set forth in claim 14, wherein said data input buffer is connected to said two of said data lines upstream of said two switches.

17. The semiconductor memory device as set forth in claim 15, wherein said two switches are turned off in case said data input buffer transmits write data to one of said memory cells while data read out to said two of data lines are held in said data line sense amplifier.

18. The semiconductor memory device as set forth in claim 16, wherein said two switches are turned off in case said data input buffer transmitts write data to one of said memory cells while data read out to said two of data lines are held in said data line sense amplifier.

19. The semiconductor memory device as set forth in claim 1, wherein said data line sense amplifier has a drive capacity larger than that of each of said bit line sense amplifiers.

20. The semiconductor memory device as set forth in claim 2, wherein said data line sense amplifier has a drive capacity larger than that of each of said bit line sense amplifiers.

* * * * *

UNITED STATES PATENT AND TRADEMARK OFFICE
CERTIFICATE OF CORRECTION

PATENT NO. : 6,262,922 B1
DATED : July 17, 2001
INVENTOR(S) : Nakamura et al.

It is certified that error appears in the above-identified patent and that said Letters Patent is hereby corrected as shown below:

<u>Title page,</u>
Item [54], Title, before "SEMICONDUCTOR" insert -- DYNAMIC TYPE --.

Signed and Sealed this

Twenty-sixth Day of February, 2002

Attest:

JAMES E. ROGAN
*Attesting Officer*   *Director of the United States Patent and Trademark Office*